(12) United States Patent
Donhauser et al.

(10) Patent No.: US 8,602,816 B2
(45) Date of Patent: Dec. 10, 2013

(54) CONNECTOR DEVICE FOR ELECTRONIC MODULES IN AUTOMATION SYSTEMS

(75) Inventors: Peter Donhauser, Amberg (DE); Gennadij Drehmann, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/299,149

(22) Filed: Nov. 17, 2011

(65) Prior Publication Data

US 2012/0129368 A1     May 24, 2012

(30) Foreign Application Priority Data

Nov. 18, 2010   (EP) ..................................... 10191655

(51) Int. Cl.
*H01R 13/60*           (2006.01)

(52) U.S. Cl.
USPC ........................................... 439/532; 439/716

(58) Field of Classification Search
USPC ......................................... 439/532, 716, 534
See application file for complete search history.

(56) References Cited

U.S. PATENT DOCUMENTS

| | | | |
|---|---|---|---|
| 3,992,654 A | 11/1976 | Springer et al. | |
| 5,104,331 A | 4/1992 | Goble | |
| 5,639,261 A * | 6/1997 | Rutkowski et al. | 439/534 |
| 5,777,843 A | 7/1998 | Younce | |
| 6,547,587 B2 * | 4/2003 | Hurst et al. | 439/532 |
| 7,066,677 B2 * | 6/2006 | Ruter | 403/231 |
| 7,234,961 B2 * | 6/2007 | Arlitt et al. | 439/410 |
| 7,335,056 B1 * | 2/2008 | Clark et al. | 439/540.1 |
| 7,544,090 B2 * | 6/2009 | Follingstad | 439/534 |
| 2008/0009182 A1 * | 1/2008 | Follingstad | 439/534 |
| 2009/0176404 A1 * | 7/2009 | Follingstad | 439/534 |

FOREIGN PATENT DOCUMENTS

| | | |
|---|---|---|
| EP | 0 844 691 | 5/1998 |
| EP | 1 267 455 | 12/2002 |
| EP | 1 524 890 | 4/2005 |

* cited by examiner

*Primary Examiner* — Gary Paumen
(74) *Attorney, Agent, or Firm* — Cozen O'Connor

(57) ABSTRACT

A connector device for electronic modules including a housing, i.e., in automation systems, having a termination panel with plug-in locations for wiring, wherein the termination panel is pivotally guidable onto the electronic module, and wherein the connector device is pivotable to a pre-wiring position outside the housing to provide access to the plug-in locations of the termination panel.

12 Claims, 10 Drawing Sheets

CONNECTOR DEVICE FOR ELECTRONIC MODULES IN AUTOMATION SYSTEMS

BACKGROUND OF THE INVENTION

1. Field of the Invention

The invention relates to connectors and, more particularly, to a connector device for electronic modules with a housing, especially in automation systems, having a termination panel with plug-in locations for wiring, where the termination panel is pivotally guidable onto the electronic module.

2. Description of the Related Art

Usually, electronic modules, i.e., peripheral modules in automation systems, are connected by connector devices, i.e., front connectors, which establish contact between the corresponding process line and the peripheral modules by substantially permanent wiring. Consequently, replacing a module only involves removing the front connector and no leads have to be disconnected.

Circuit boards, modules or plug-in boards for electronic control devices are advantageously inserted into a standard housing. In such cases, a module carrier receives the modules able to be plugged in by guide rails. The modules are supplied with power or signals by termination contacts that are attached either to the front, or the rear or side, respectively. The modules can also be wired to each other from the rear.

The housings have defined dimensions, are used to accommodate circuit boards and are built into standard switching cabinets. A housing is constructed from two side sections with attachment flanges that are connected to one another by four (4) extruded profiles. The housing is screwed into an electronics cabinet using the two attachment flanges.

Plug-in modules inserted into the housing, such as circuit boards, are controlled by external process signals or are connected to other plug-in modules. For this purpose, plug-in connectors, i.e., front connectors comprising connector strips are used, which are pushed onto the plug-in module from the operating side. In selecting the plug-in connectors, in addition to cost effectiveness and the required contact pins, the primary consideration is reliability of the plug-in connector, mechanical robustness, the ability to combine parts supplied by different manufacturers, insulation capabilities and current loading. While the generally-used plug-in connectors for direct connection fulfill all the cost effectiveness and reliability requirements, the number of contact pins is often not sufficient. The front process connector is particularly used for peripheral devices if, for example, a spatial separation of the system cable from the signal cables within the electronics is required to avoid electrical interference.

The disadvantage of the prior art connectors, however, is that plug-in connectors for electronic modules in automation systems that are able to be installed using pivot technology have previously not had any pre-wiring position. With these plug-in devices this leads to the termination panels, i.e., the terminals, being located inside the electronic module during wiring. Introducing the conductors is thus not a simple matter and the terminals are difficult to access.

SUMMARY OF THE INVENTION

It is accordingly an object of the present invention to provide a plug-in connector device for electronic modules which allows easy access for pre-wiring.

This and other objects and advantages are achieved by a plug-in connector device for an electronic module having a housing, i.e., in automation systems, where the connector device has a termination panel with plug-in locations for wiring, the termination panel is guidable onto the electronic module using a pivoting technique, and the connector device is pivotable to a pre-wiring position on the electronic module in which the connector device is not electrically connected to the electronic module.

In accordance with the invention, the plug-in connector device, preferably a front connector, makes pivotal contact with the electronic module and a latching element is provided in the upper area of the connector device which makes it possible to lock the module in position. The connector device in accordance with the invention is configured to pivot, which reduces plug-in and extraction forces. In accordance with the invention, a connector support is responsible both for the pre-wiring and also for the contacting. The connector device in accordance with the invention latches firmly in the pre-wiring position with the electronic module. This is effected by a latching system. By the use of support pins, which otherwise serve as introduction cams, the connector device is suspended in the pre-latching support position and is latched to the electronic module by pivoting onto it. The locking mechanism attached to the connector device latches the connector to the module even in this pre-wiring position. In this connector position, the connection terminals, i.e., the wiring panel, are located outside the electronic module and are easily accessible. Here, the contact system consisting of female and male connectors is not yet engaged.

In an especially advantageous embodiment, the connector device is latchable in the pre-wiring position with the electronic module. By the use of support pins, which otherwise serve as introduction cams, the connector device is suspended in the pre-latching position and is latched to the module by pivoting onto it. The locking mechanism attached to the connector device latches the connector to the module even in this position. In this connector position, the connecting terminations, i.e., the wiring panel, are located outside the module and are easily accessible. In such cases, the contact system consisting of female and male connectors is not yet engaged.

In an especially advantageous embodiment, the connector device of the module is guidable onto the module at different angles of inclination, where in particular the connector inclination to the module is around 45° to 135°. In this case, there is a technical requirement that with the different angles of inclination the connector device must be guided securely onto the contacting support point and in such cases an encoding element can be accommodated.

Here, the great advantage of the contemplated embodiments of the connector device especially lies in the fact that a very wide range of inclination angles can be selected. In this selected range of inclination angles, the contemplated embodiments of the connector device always finds a selected encoding. An encoding element is arranged in the area of the connector support in the as-delivered state on the electronic module. After the first pivoting-in and pivoting out of the connector device, a part of the encoding element is removed by the connector device, so that the connector device only then fits on the same type of electronic module.

In a further advantageous embodiment the plug-in locations are arranged outside the module in the pre-wiring position. For this purpose, the connector device is latched firmly in the pre-wiring position with the electronic module. By the use of support pins, which otherwise serve as introduction cams, the connector device is suspended in the pre-latching position and is latched to the module by pivoting onto the module. The locking mechanism attached to the connector device even latches the connector to the electronic module in this position. In this connector position, the terminations are located outside the module and are easily accessible. Here, the contact system consisting of female and male connectors is not yet engaged.

Furthermore, in accordance with the contemplated embodiments of the invention, the connector device is unlocked from the pre-wiring position by a locking mechanism. By guiding the connector device into the front panel, the connector device is guided along support pins in the pre-latching position directly to the contacting support point. The connector device does not need to be removed from the pre-latching position but only lifted slightly from the support position and then brought into the contacting support position by pushing it in. This describes the process of installing the connector device on the module into the contacting position from a preceding pre-wiring position.

In other contemplated embodiments, it is also possible, however, for the already wired connector device to be pivoted directly into the contacting support position. In this case, the connector device is guided onto the module from outside. The support pins of the pre-latching position guide the connector device directly into the contacting support position. If the connector device with its support shell is in the contacting support position, an electrical contact is established by pivoting it inwards, and the connector device is mechanically locked with the module.

In an especially advantageous embodiment, the connector device is guidable onto a contacting support point by an inlet guide link in the housing of the electronic module along a support pin. In such cases, the inlet guide link allows the connector device to make a defined movement towards the module.

In an especially advantageous embodiment, the module includes an encoding element in the as-delivered state. The encoding element is arranged in the area of the contacting support point and is positioned on the electronic module in the as-delivered state. After the first pivoting-in and pivoting-out of the connector device, a part of the encoding element is removed by the connector device, so that the connector device only then fits on the same module type.

In a further exemplary embodiment, the connector device is removable from the electronic module by pivoting it out downwards, so that the connector device is arranged at an angle of approximately 90° to the electronic module. The presently contemplated embodiment represents a further additional removal option, because technically the option also exists of using the guide links for removal. The removal option makes provision for the latching mechanism to be released by pulling on the locking latch and for the connector device to be pulled or pivoted out away from the module. This is made possible by a break in the guide grooves of the module so that the connection device in the pivoted-out state can be removed directly from the module. This additional removal option means that it is no longer necessary to adhere to the reverse sequence of installation.

In its pre-wiring position, the contemplated embodiments of the connector device makes easy access for pre-wiring outside the electronic module possible. The additional use of an encoding element contributes to enabling connector devices of the same module type to be used. The disclosed embodiments of the connector device make it possible both to move a pre-wired connector into the contacting position without passing through the prewiring position and also to move a non-pre-wired connector by the pre-wiring position into the contacting position. In addition, the embodiments of the connector device are usable in a wide range of angles of inclination from approximately 45° to 135°. It is likewise advantageous that a break in the guidance grooves of the electronic module makes direct removal from the electronic module possible, so that removal does not have to follow the reverse sequence of assembly.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Further advantages and embodiments of the invention are explained below with reference to exemplary embodiments and also with reference to the drawing, in which.

DETAILED DESCRIPTION OF THE PRESENTLY PREFERRED EMBODIMENTS

Figure 1:
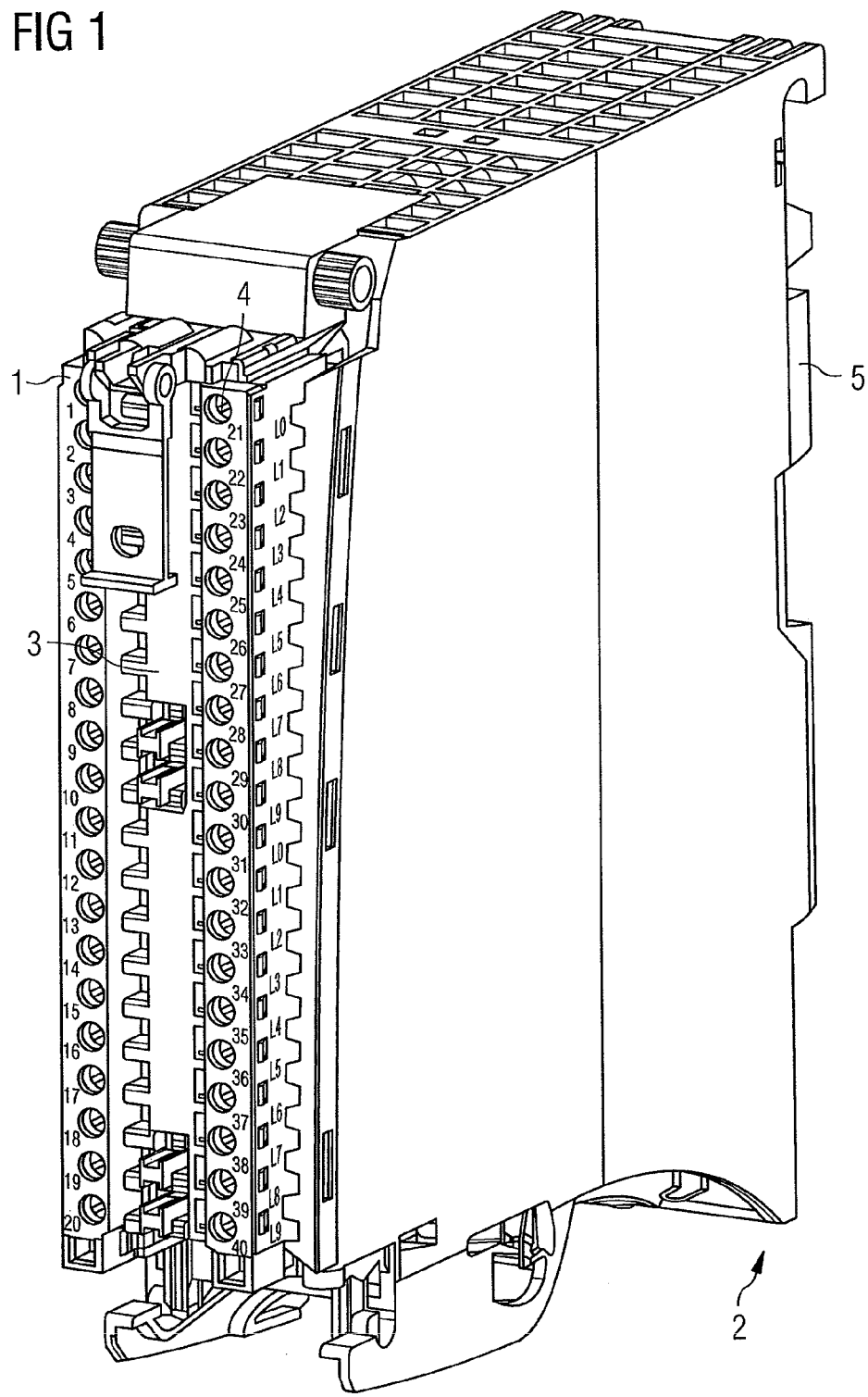
FIG. 1 is a perspective diagram of a connector device in a pre-wiring position built into an electronic module in accordance with the invention.

FIG. 1 shows a connector device 1 in accordance with the invention, which is built into an electronic module 2. The connector device 1 preferably comprises a front connector and has a termination panel 3 in which plug-in locations 4 are arranged for electrical leads. The electronic module 2 has a housing 5, which preferably comprises a rectangular shape, with one side section being shaped as an opening so that the connector device 1 is able to be pushed into this opening.

Figure 2:
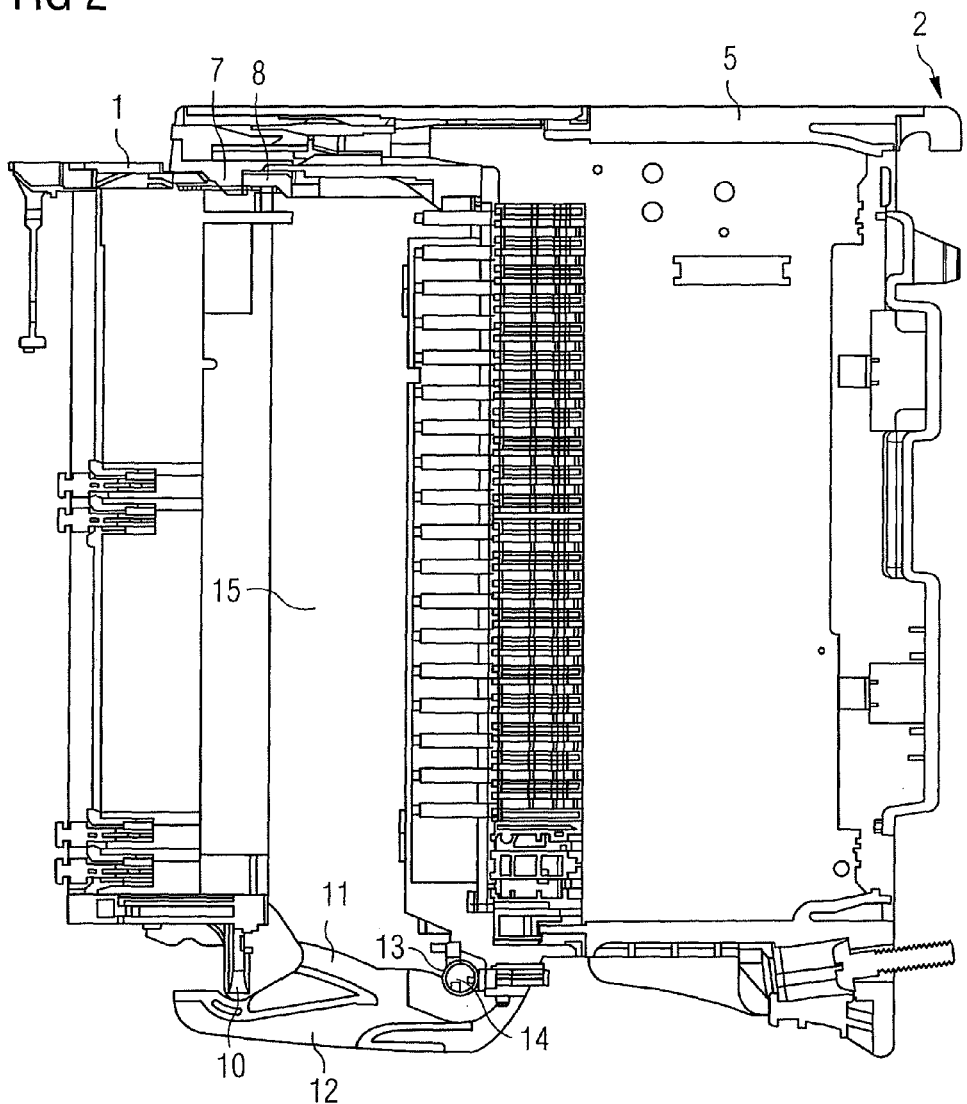
FIG. 2 is a cutaway diagram of a connector device in the pre-wiring position in an electronic module in accordance with the invention.

FIG. 2 shows the connector device 1 in accordance with the invention in the pre-wiring position in which it is locked onto the electronic module 2. The electronic module 2 has a locking lug 7 in a housing cover area 6 (see FIG. 3) that engages with a locking hook 8 on the connector device 1. In addition, the housing 5 of the electronic module 2, which can comprise two parts as a front cover in the area of the connector device 1 and a base housing connected thereto, has a pre-wiring support point 10 in the housing underfloor area 9 (see FIG. 7) which also fixes the connector device 1 in the lower area of the housing 5 of the electronic module 2 so that the connector device 1 can be equipped with the electrical leads in this pre-wiring position.

Two guide links 11, 12 are also evident from FIG. 2, which are arranged in the vicinity of the housing underfloor area 9. The guide links 11, 12 can be reached by the connector device 1 by lifting it slightly from the pre-wiring support point 10. One guide link 11 runs in a slight arc downwards and in doing so moves towards a contacting support 13 that is arranged laterally next to an encoding element 14, which is attached in a complete state to the electronic module 2 in the as-delivered state. Arranged between the connector device 1 and the electronic module 2 is a free area 15 so that the contact system comprising female and male connector is not yet contacted in the pre-wiring position.

Figure 3:
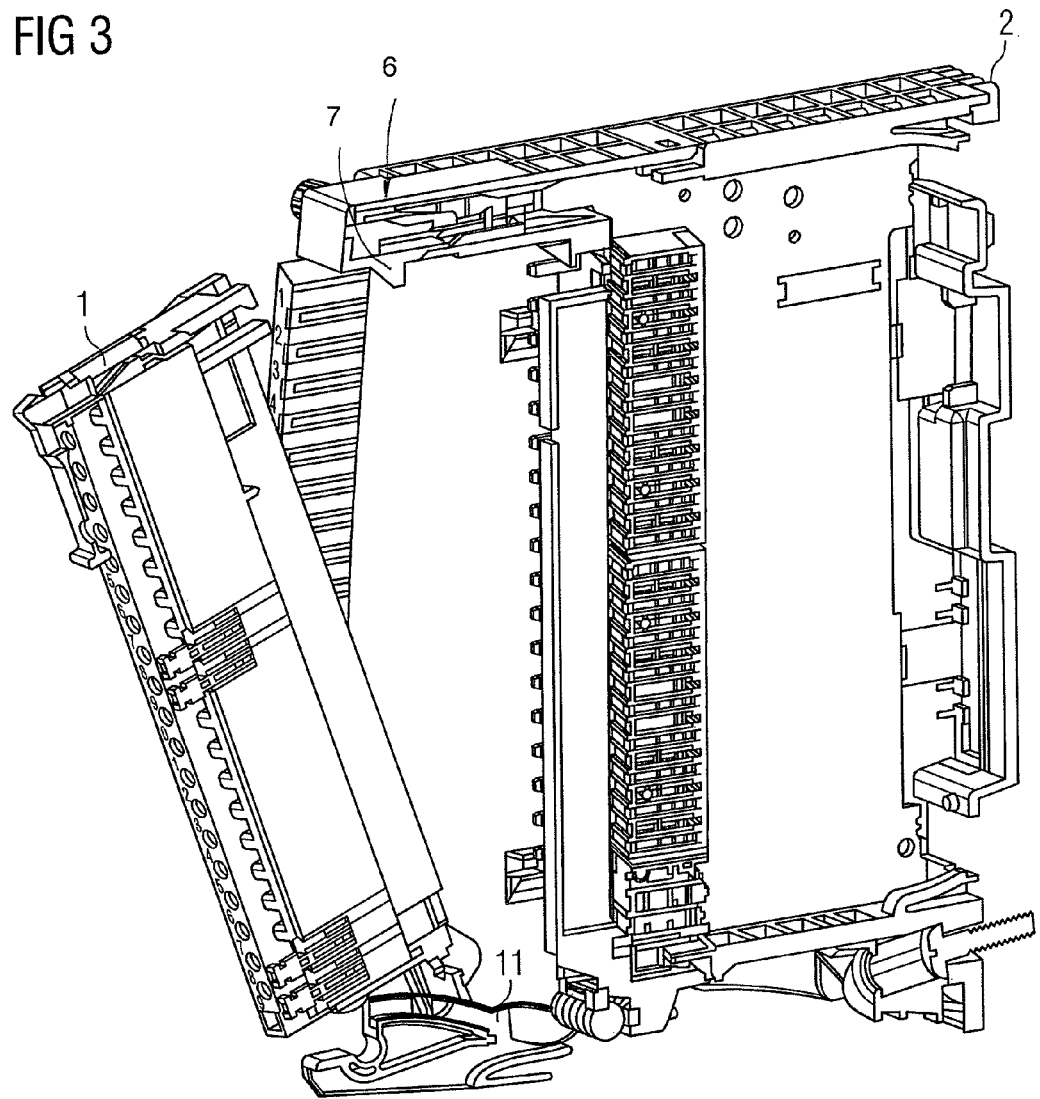
FIG. 3 is a perspective diagram of the connector device which is moving from the pre-wiring position into the contacting position in accordance with the invention.

FIG. 3 shows the connector device 1 in accordance with the invention which is moving on the guide link 11 from the pre-wiring position into the contacting position.

Figure 4:
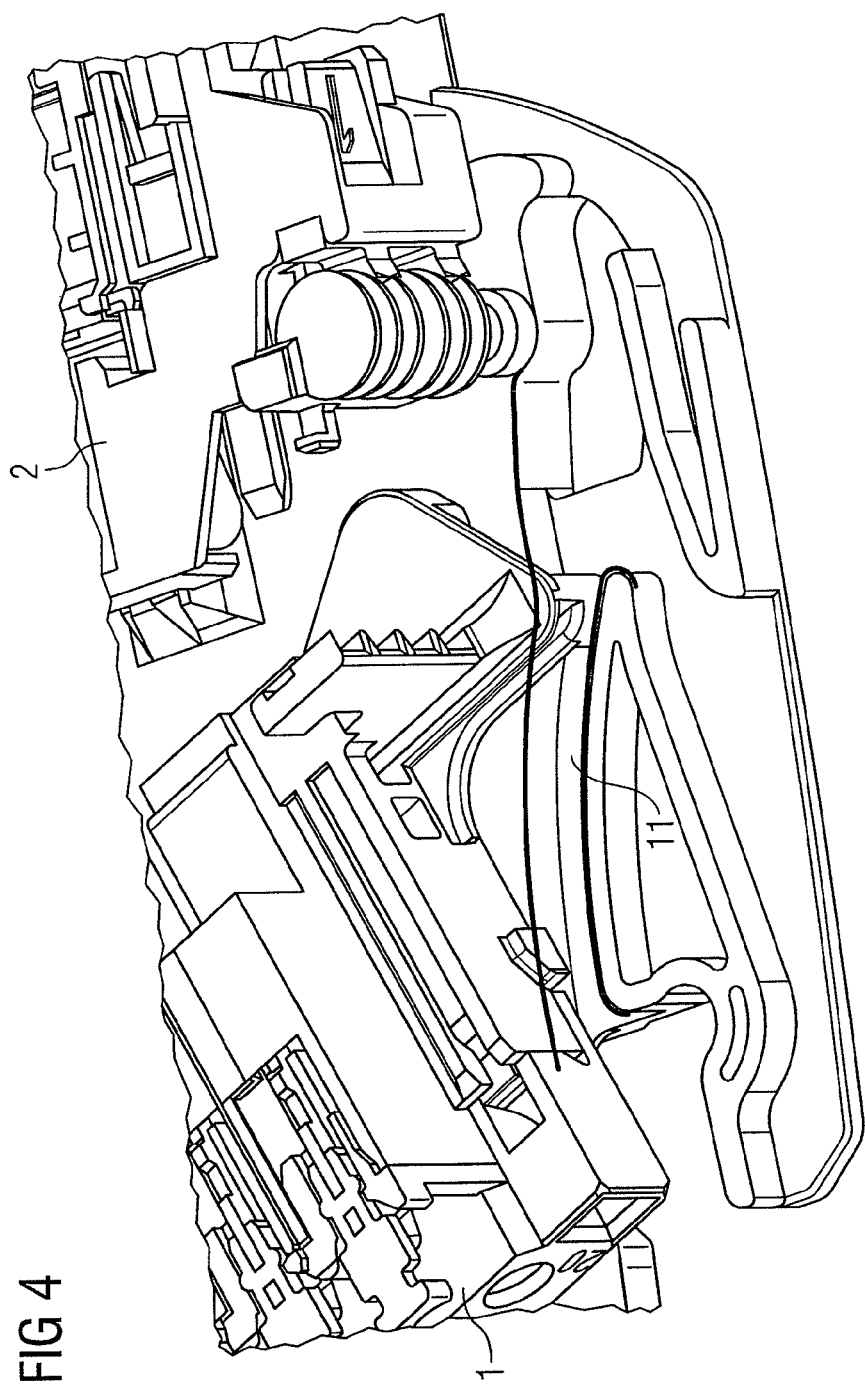
FIG. 4 is a perspective diagram of a section from FIG. 3, which shows the guide link arranged in the housing wall of the module to which the connector device switches from pre-wiring position into the contacting position in accordance with the invention.

An enlarged section from FIG. 3 is shown in FIG. 4 which shows the guide link 11 arranged in the housing wall of the module 2 on which the connector device 1 switches from the pre-wiring position into the contacting position. Here, the guide link 11 essentially comprises a preferably arc-shaped guide web on which the connector device 1 is guided.

The connector device 1 in accordance with the invention can either be equipped with the electrical leads in the pre-wiring position or can be wired externally to then be transferred directly into the contacting position. In this case, the connector device 1 is guided from outside onto the module 2. The support pins (not shown) of the pre-latching position guide the connector device directly into the contacting support position (see FIG. 5). If the connector device 1 with a support cover is located in the contacting support position 13, electrical contacting is established by pivoting it inwards and the connector device 1 is mechanically locked with the module 2.

Figure 5:
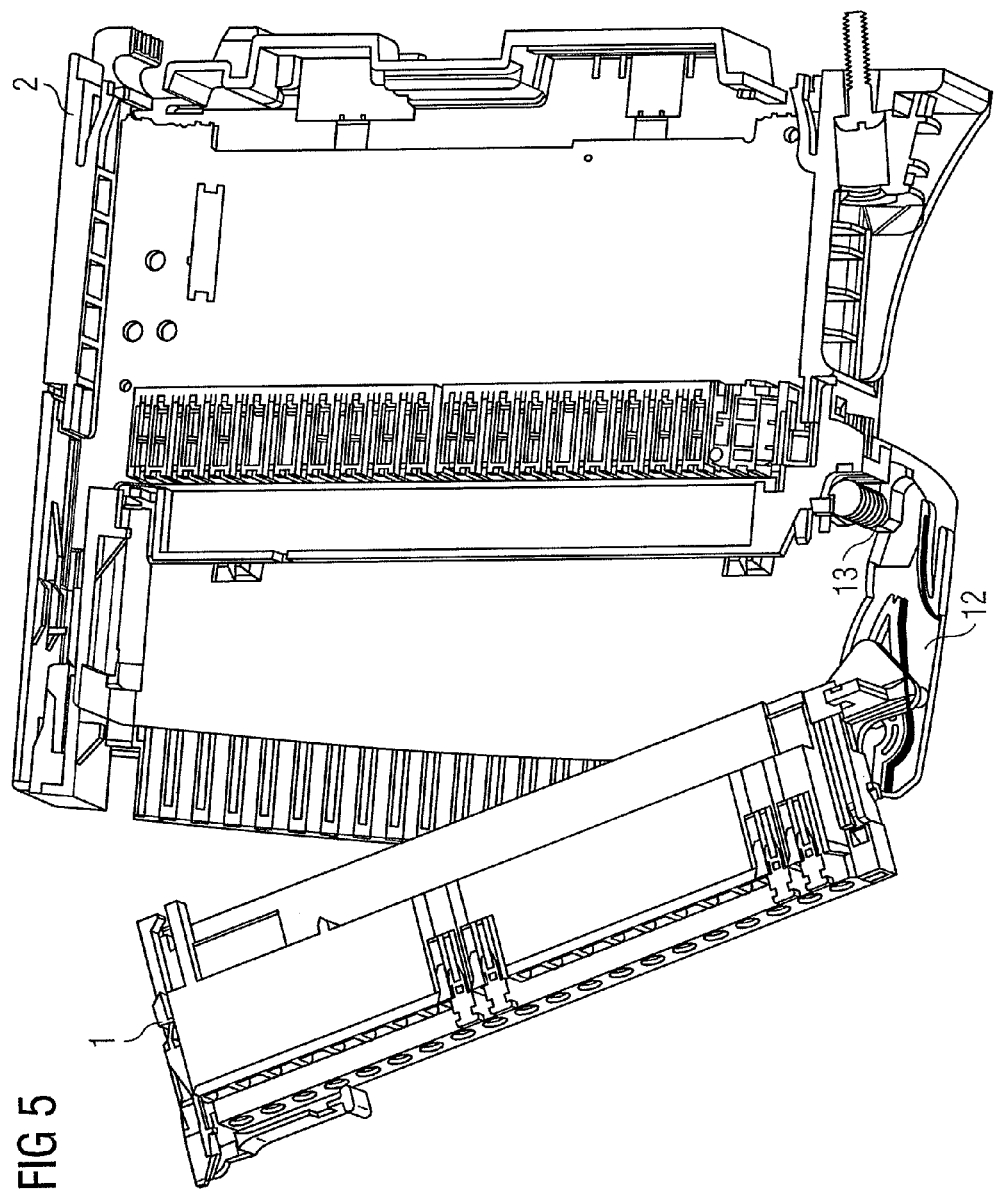
FIG. 5 is a perspective diagram of the connector device which switches its contacting position for external wiring in accordance with the invention.

For this purpose, the connector device 1 in accordance with the invention which is being transferred with external wiring into the contacting position is shown in FIG. 5. The guide link 12 is used for this purpose. The guide link 12 extends from below in a slight arc shape in the direction of the contacting support point 13.

Figure 6:
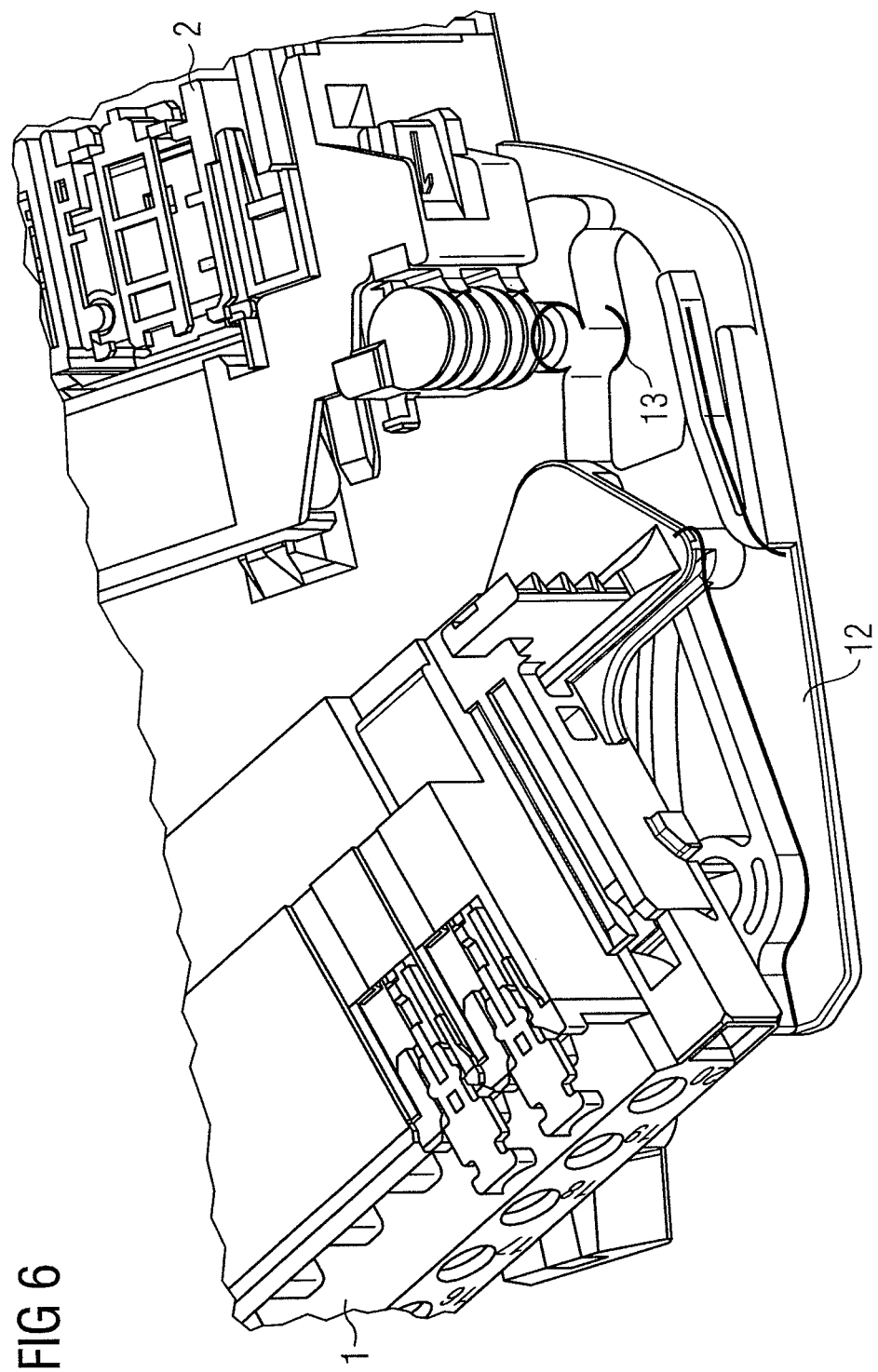
FIG. 6 is a perspective diagram of a section from FIG. 5, which shows the guide link arranged in the housing wall of the module to which the connector device switches to the contacting position for external wiring in accordance with the invention.

An enlarged section from FIG. 5 is shown in FIG. 6 which shows the guide link 12 arranged in the housing wall of the module 2 on which the connector device 1 switches into the contacting position with external wiring.

Figure 7:
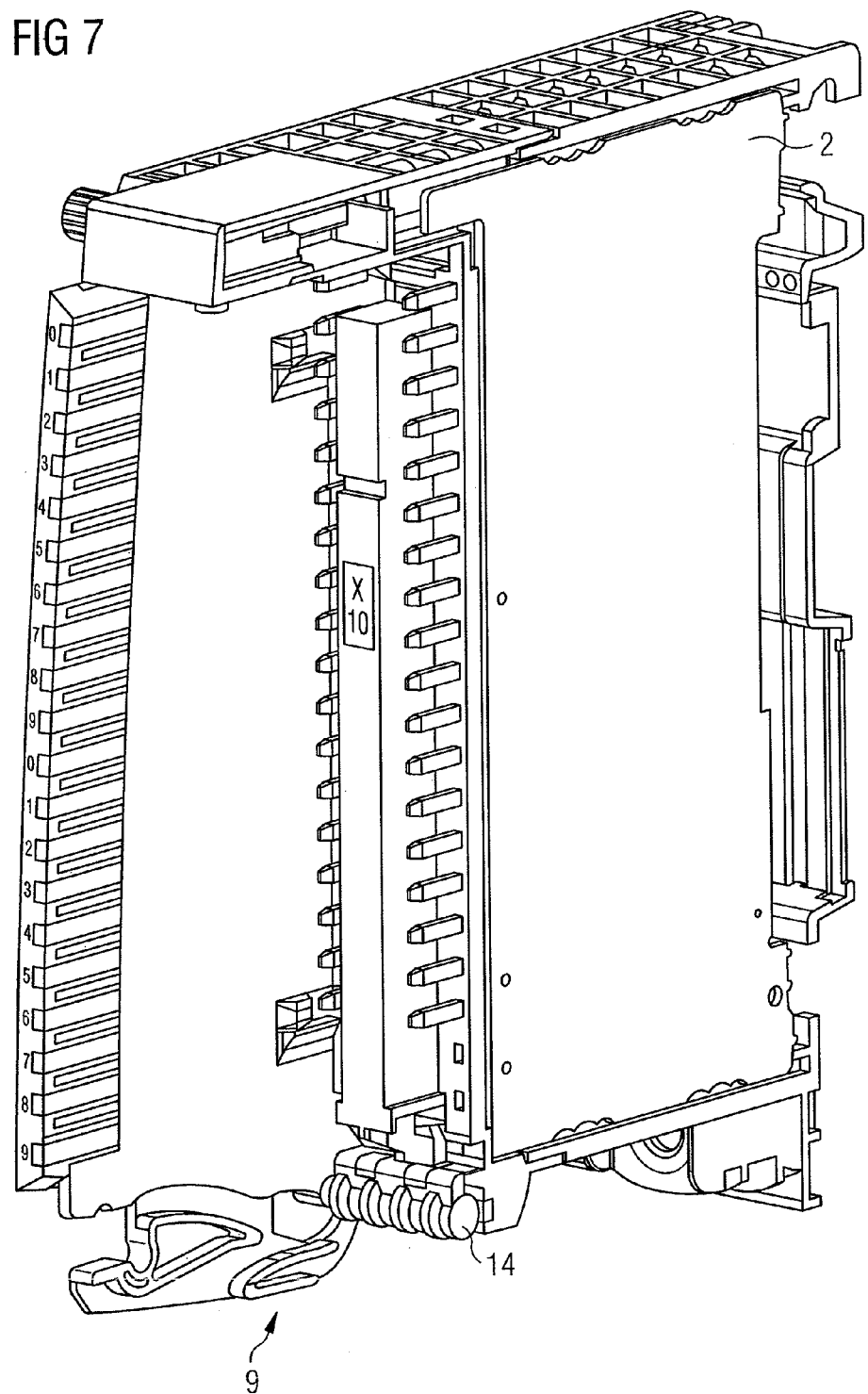
FIG. 7 is a perspective diagram of an electronic module with encoding element in the as-delivered state in accordance with the invention.

The electronic module 2, which has an encoding element 14 in the vicinity of the housing underfloor area 9 which is fixed in a complete state to the electronic module 2 in the as-delivered state, is shown in FIG. 7. When the connector is pivoted into the contacting position, the encoding element 14 will be received by the connector device 1. On pivoting out, the encoding element 14 will be broken. One half remains on the module 2, the other half is taken with it as encoding by the connector device 1.

Figure 8:
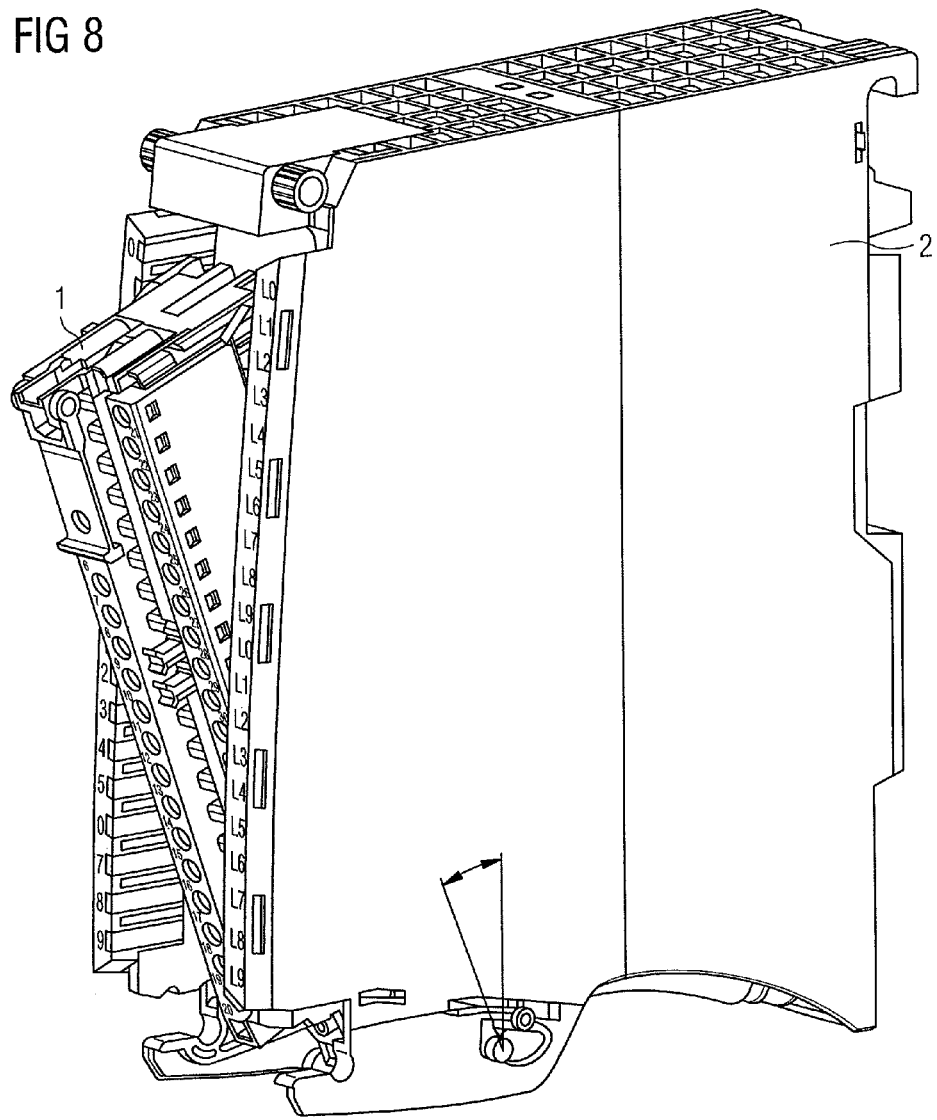
FIG. 8 is a perspective diagram of the inventive connector device when pivoted out from an electronic module in accordance with the invention.

FIG. 8 shows the inventive connector device 1 in accordance with the invention when pivoted onto and pivoted away from the electronic module 2. In the as-delivered state, the module 2 brings with it the encoding element 14 in the area of the connector support. The connector device 1 can be guided onto the module at an angle of preferably 45 to 135°. The encoding element 14 always finds the receptacle in the connector device 1.

Figure 9:
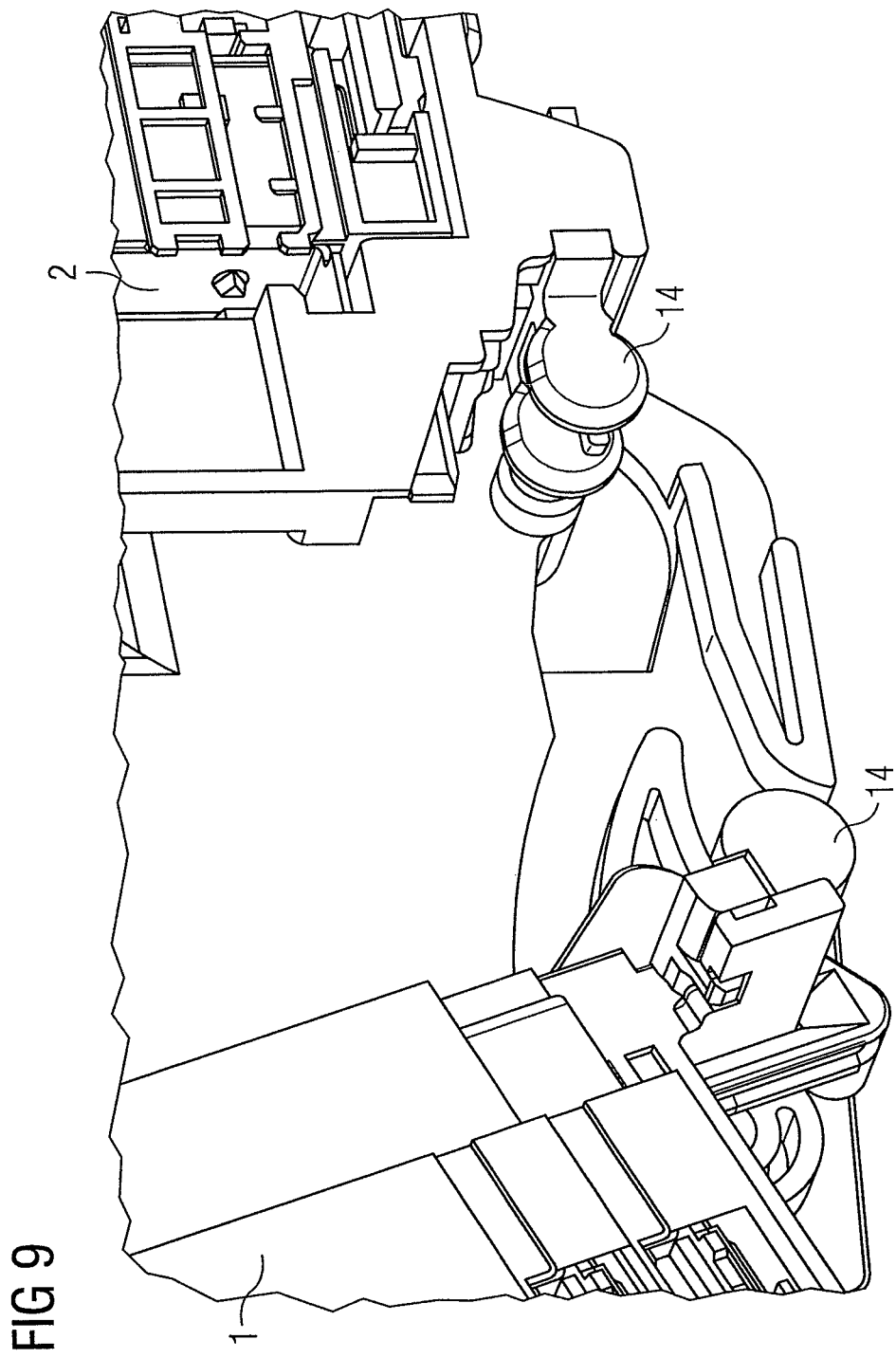
FIG. 9 is a perspective diagram of the connector device pivoted out from an electronic module, wherein the encoding element is separated into two parts in accordance with the invention.

FIG. 9 shows the connector device 1 in accordance with the invention when it is pivoted out from the electronic module 2, where the encoding element 14 is separated into two parts. One part of the encoding is now located on the connector device 1, while the other part of the encoding element 14 remains on the electronic module 2. The result of this encoding is that when these components are next joined together the connector device 1 in accordance with the invention only fits on this type of electronic module 2.

Figure 10:
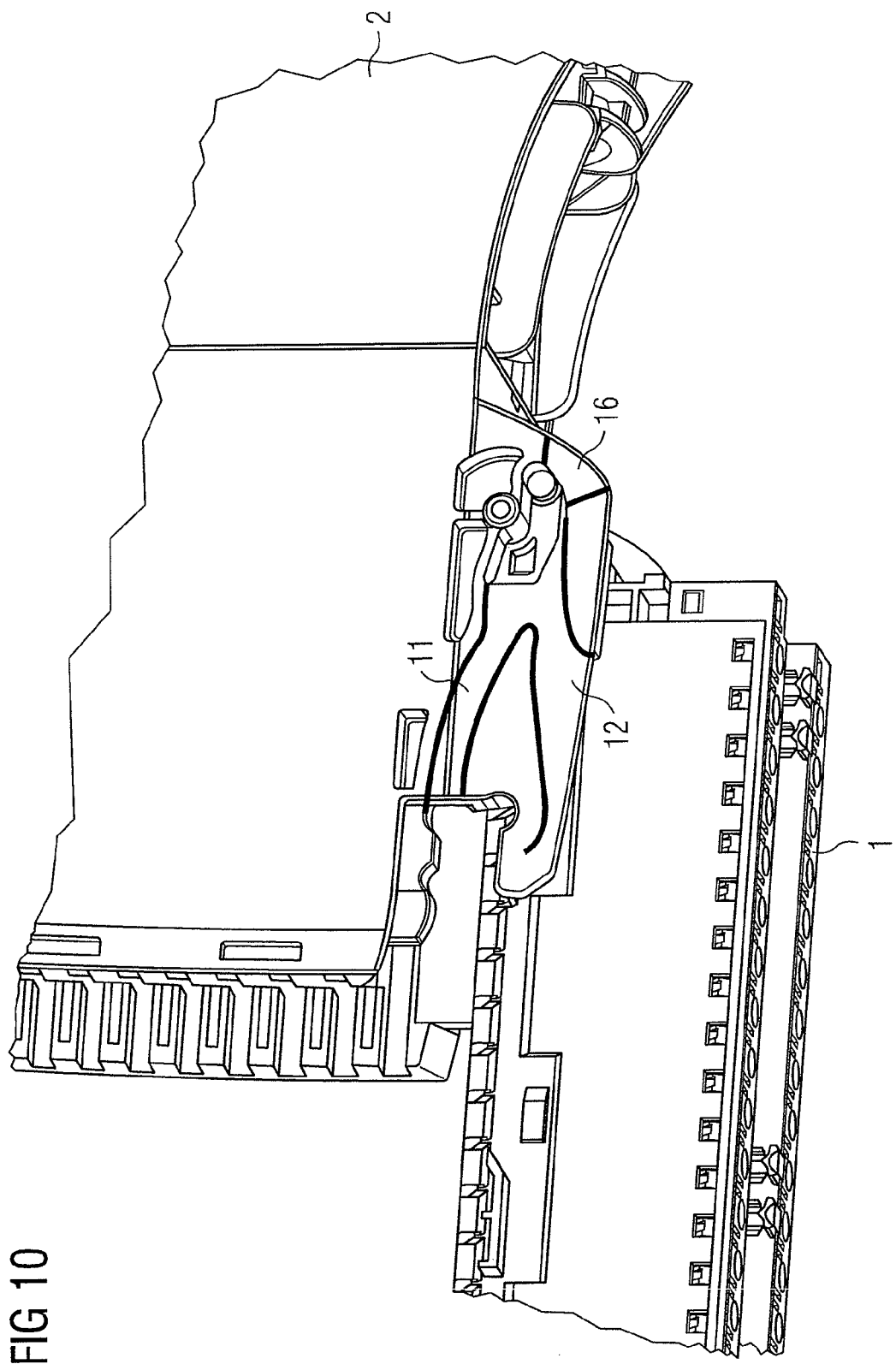
FIG. 10 is a perspective diagram of the option for removal of the connector device from the electronic module after it has been pivoted out in accordance with the invention.

FIG. 10 shows the options for removing the connector device 1 from the electronic module 2 after it has been pivoted out. Pressing on the locking tab releases the latching mechanism and the connector device 1 is actuated in the same direction as the locking mechanism and is pulled or pivoted away from the module. A gap in the guide slots of the module makes it possible for the connector device 1 to be removed directly from the module 2 from the pivoted-out state. The connector device 1 thus does not have to adhere to the reverse order of assembly. The guide links in 11, 12 as well as the direct removal options 16 are shown in FIG. 10.

The connector device in accordance with the invention, in its pre-wiring position, facilitates easily accessible pre-wiring outside the electronic module. The additional use of an encoding element contributes to connector devices of the same module type being able to be used. The connector device in accordance with the invention enables both a pre-wired connector to be guided into the contacting position without passing through the pre-wiring position and also enables a non-pre-wired connector to be guided from the pre-wiring position into the contacting position. In addition, the connector device in accordance with the invention is able to be used at a wide range of angles of inclination from around 45° to 135°. It is likewise advantageous for a gap in the guide slots of the electronic module to facilitate direct removal from the electronic module, so that removal does not have to follow the reverse sequence of assembly.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electronic module comprising:
   a housing having electronic components therein; and
   a connector device disposed in the housing; said connector device comprising:
   a termination panel including plug-in locations for wiring, the termination panel being pivotally guidable onto the housing;

wherein the connector device to be assembled is pivotable to a pre-wiring position on the housing in which the connector device is arranged outside the housing, whereby access is provided to the plug-in locations of the termination panel.

2. The electronic module as claimed in claim 1, wherein the connector device is latchable with the housing in the pre-wiring position.

3. The electronic module as claimed in claim 1, wherein the connector device is guidable onto the housing at different angles of inclination; and
wherein the connector device is provided to angle towards the electronic module at an angle of about 45° to 135°.

4. The electronic module as claimed in claim 2, wherein the connector device is guidable onto the housing at different angles of inclination; and
wherein the connector device is provided to angle towards the housing at an angle of about 45° to 135°.

5. The electronic module as claimed in claim 1, wherein the connector device has includes a pre-wiring support point.

6. The electronic module as claimed in claim 5, wherein the connector device is unlockable from the pre-wiring position by a locking mechanism.

7. The electronic module as claimed in claim 1, wherein the connector device is guidable by a support pin onto a contacting support point of the electronic module by guide links in the housing of the electronic module.

8. The electronic module as claimed in claim 1, wherein the electronic module comprises an encoding element in an as-delivered state of the housing.

9. The electronic module as claimed in claim 8, wherein the housing has a contacting support point, and when the connector device is initially pivoted onto the housing at the contacting support point, a part of the encoding element is transferrable onto the connector device, so that the connector device is subsequently only guidable onto the housing encoded in this way.

10. The electronic module as claimed in 1, wherein the connector device is directly removable from the housing by outwardly pivoting the connector device downwards; and wherein the connector device is arranged at an angle of about 90° to the housing.

11. The electronic module as claimed in claim 1, wherein the housing includes a pre-wiring support point and a contacting support point, the connector device being pivotable at the pre-wiring support point to the pre-wiring position, the connector device being guidable to the contacting support point via guide links in the housing, and the connector device being pivotable at the contacting support point to a contacting position, in which the connector device electrically contacts the housing.

12. The electronic module as claimed in claim 11, wherein the connector device is lockable with the housing in both the pre-wiring position and the contacting position.

* * * * *